United States Patent
Chiu

(10) Patent No.: US 9,607,883 B2
(45) Date of Patent: *Mar. 28, 2017

(54) TRENCH FORMATION USING ROUNDED HARD MASK

(71) Applicant: Taiwan Semiconductor Manufacturing Company, Ltd., Hsin-Chu (TW)

(72) Inventor: Chien-Chih Chiu, Xinying (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 14/806,384

(22) Filed: Jul. 22, 2015

(65) Prior Publication Data

US 2015/0325469 A1 Nov. 12, 2015

Related U.S. Application Data

(63) Continuation of application No. 14/103,491, filed on Dec. 11, 2013, now Pat. No. 9,105,697.

(51) Int. Cl.
  *H01L 21/311* (2006.01)
  *H01L 21/768* (2006.01)
  *H01L 21/32* (2006.01)
  *H01L 21/3205* (2006.01)

(52) U.S. Cl.
  CPC .. *H01L 21/76802* (2013.01); *H01L 21/31116* (2013.01); *H01L 21/31144* (2013.01); *H01L 21/32* (2013.01); *H01L 21/32051* (2013.01); *H01L 21/76804* (2013.01); *H01L 21/76843* (2013.01); *H01L 21/76877* (2013.01)

(58) Field of Classification Search
  USPC ....... 438/700, 653, 674, 673, 671, 675, 689, 438/717, 736, 942
  See application file for complete search history.

(56) References Cited

U.S. PATENT DOCUMENTS

| | | | |
|---|---|---|---|
| 8,476,168 B2 | 7/2013 | Graves-Abe et al. | |
| 9,105,697 B2 * | 8/2015 | Chiu | H01L 21/76877 |
| 2007/0049037 A1 | 3/2007 | Graettinger et al. | |
| 2012/0149204 A1 | 6/2012 | Hsieh et al. | |

* cited by examiner

Primary Examiner — Timor Karimy
(74) Attorney, Agent, or Firm — Slater Matsil, LLP

(57) ABSTRACT

A method embodiment includes forming a hard mask over a dielectric layer, patterning the hard mask to form an opening, forming a passivation layer on sidewalls of the opening, and forming a trench in the dielectric layer by extending the opening into the dielectric layer using an etching process. The sidewalls of the opening are etched to form a rounded profile in the hard mask and a substantially perpendicular profile in the dielectric layer.

20 Claims, 5 Drawing Sheets

TRENCH FORMATION USING ROUNDED HARD MASK

CROSS-REFERENCE TO RELATED APPLICATIONS

The present application is a continuation of U.S. patent application Ser. No. 14/103,491, filed on Dec. 11, 2013, entitled "Trench Formation using Rounded Hard Mask," which application is hereby incorporated herein by reference.

TECHNICAL FIELD

The present invention relates generally to a system and method for semiconductor device manufacturing, and, in particular embodiments, to a system and method for creating trenches in a semiconductor device layer.

BACKGROUND

Generally, a semiconductor device includes interconnect structures electrically connecting active devices (e.g., transistors or capacitors) to create functional circuits. These interconnect structures include conductive features (e.g., metal lines and vias) formed in various dielectric layers. The formation of conductive features (e.g., metal lines and vias) in a dielectric layer generally involves patterning the dielectric layer to form trenches and filling the trenches with a conductive material.

Typically, trench formation is done using a combination of photolithography and etching. A hard mask may be disposed over a dielectric layer as a patterning mask for etching the dielectric layer. As the desired critical dimensions (e.g., width of trenches and/or the spacing between trenches) become smaller and smaller in advanced semiconductor devices, traditional methods for patterning hard masks and dielectric layers may result in large overhangs on sidewalls of a trench and other issues. These defects may negatively affect yield, subsequent trench filling processes, and leakage control issues.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION OF ILLUSTRATIVE EMBODIMENTS

The making and using of the embodiments of the disclosure are discussed in detail below. It should be appreciated, however, that the embodiments provide many applicable concepts that can be embodied in a wide variety of specific contexts. The specific embodiments discussed are illustrative, and do not limit the scope of the disclosure.

Trench formation in semiconductor devices using rounded hard masks is provided in accordance with various embodiments. The intermediate stages of forming the trenches in the semiconductor device are illustrated. The variations of the embodiments are discussed. Throughout the various views and illustrative embodiments, like reference numbers are used to designate like elements.

Figure 1:
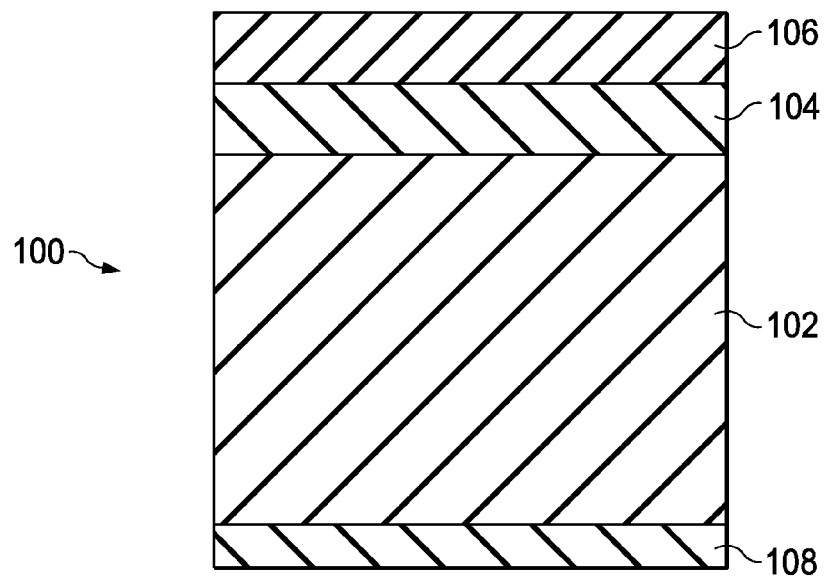
FIGS. 1-8 are cross-sectional views of various stages of manufacturing for forming trenches in a semiconductor device in accordance with various embodiments.

FIG. 1 shows a portion of a semiconductor device 100. Semiconductor device 100 includes a dielectric layer 102, which may be disposed over a substrate (not shown). Active devices (not shown) such as transistors may be formed at a top surface of the substrate. The substrate may be a bulk silicon substrate although other semiconductor materials including group III, group IV, and group V elements may also be used. Alternatively, the substrate may be a silicon-on-insulator (SOI) substrate.

Dielectric layer 102 may be an inter-layer dielectric (ILD) or an inter-metal dielectric layer (IMD) formed using any suitable method (e.g., chemical vapor deposition (CVD), plasma enhanced CVD (PECVD), a spin on technique or the like). Dielectric layer 102 may be formed of low-k dielectric materials having k values, for example, lower than about 4.0. Dielectric layer 102 may also formed of extra low-k (ELK) material having a k-value lower than about 2.8. In some embodiments, dielectric layer 102 may comprise silicon oxide, SiCOH, or the like. Although FIG. 1 illustrates only one dielectric layer 102, semiconductor device 100 may include numerous dielectric layers. An etch stop layer 108 (e.g., a silicon nitride layer, a silicon carbide layer, or the like) may be formed under dielectric layer 102.

An oxide layer 104 and a hard mask 106 may be formed over dielectric layer 102. Hard mask 106 may be a metal hard mask comprising, for example titanium nitride, titanium oxide, tantalum nitride, or the like. Other hard mask materials may also be used. Hard mask 106 may further include an anti-reflective coating layer (e.g., a nitrogen free anti-reflective coating (NFARC), not shown) to aid in the patterning of hard mask 106. Oxide layer 104 may be disposed between hard mask 106 and dielectric layer 102, and oxide layer 104 may be formed, for example, through thermal oxidation of dielectric layer 102. Oxide layer 104 may act as a buffer layer and/or an adhesion layer between dielectric layer 102 and hard mask 106. Oxide layer 104 may also act as an etch stop layer for patterning hard mask 106.

Figure 2:
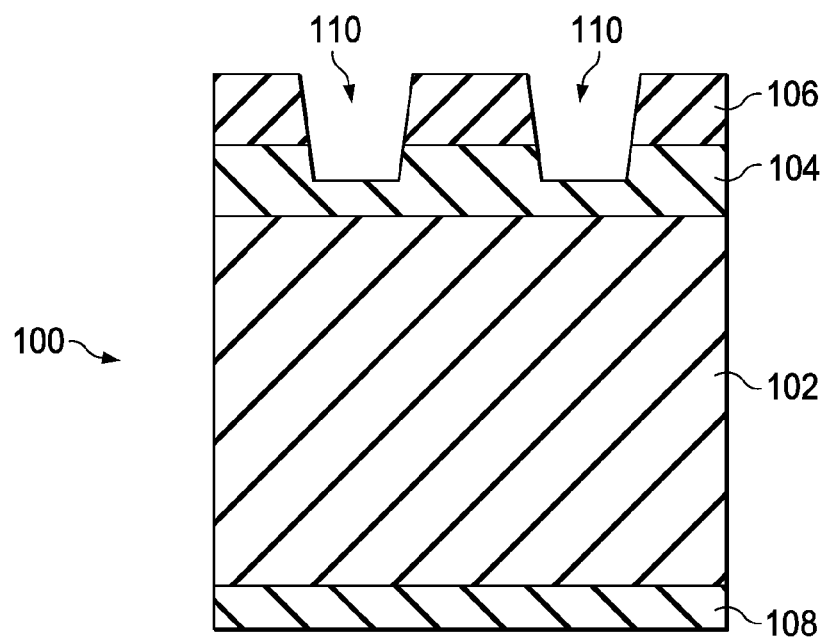

FIG. 2 illustrates the patterning of hard mask 106 to form openings 110. Openings 110 may extend through hard mask 106 and partially into oxide layer 104. In various embodiments, the patterning of hard mask 106 may be through a combination of photolithography and etching techniques. For example, a photoresist (not shown) may be disposed over hard mask 106. Portions of the photoresist may be exposed (e.g., using an ultraviolet light or an excise laser) through a patterning mask. The exposed or unexposed portion of photoresist may be then removed depending on whether a positive/negative resist was used, and hard mask 106 may be etched using the patterned photoresist as a mask. Subsequently, the photoresist may be removed (e.g., using an ashing technique). The etching of hard mask 106 may include a dry etching process using, for example, $C_xF_y$ (i.e., a fluorocarbon such as tetrafluoromethane, octafluoropropane, or the like), $N_2$, $O_2$, Ar, or the like as a process gas. Oxide layer 104 may act as an etch stop layer during the patterning of hard mask 106.

Figure 3:
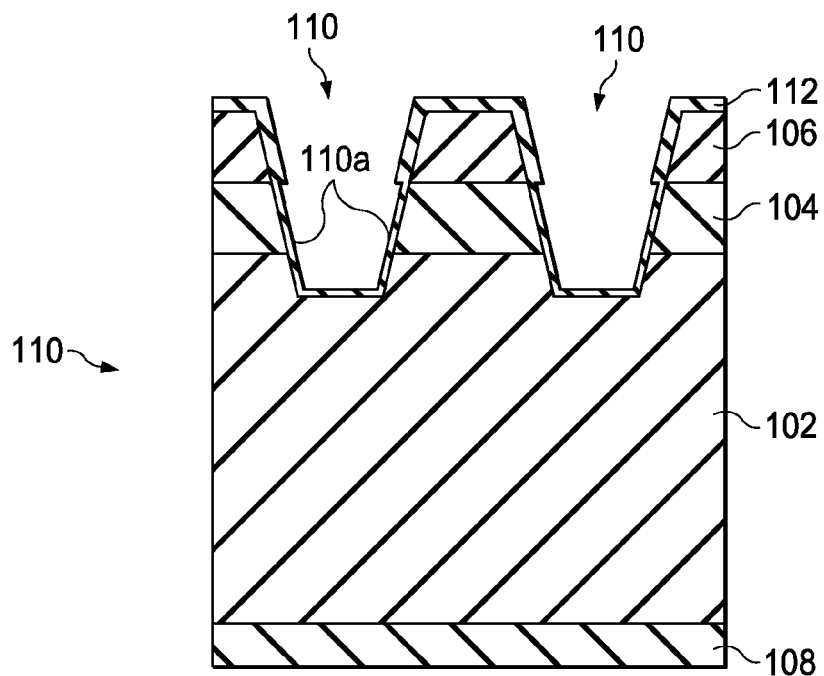

FIG. 3 shows the etching oxide layer 104 using hard mask 106 as a patterning mask. The etching extends openings 110 through oxide layer 104 and may further extend openings 110 past a top surface of dielectric layer 102. The etching of oxide layer 104 may also taper sidewalls 110a of openings 110 to have a slanted, non-perpendicular profile. For example, sidewalls 110a may have an angle of about 80° after etching.

Furthermore, a residual byproduct of the process gas used during the etching process may form a polymer rich passivation layer 112 on exposed surfaces of semiconductor device 100 (e.g., sidewalls of openings 110). Due to differences in the chemical reaction between the process gas and the material of hard mask 106 (e.g., a metal) versus oxide layer 104/dielectric layer 102, passivation layer 112 may be formed more prevalently (i.e., thicker) on hard mask 106 than on other surfaces of openings 110. As a result of passivation layer 112, the etch rate of hard mask 106 may be significantly lower than the etch rate of oxide layer 104 and dielectric layer 102 during subsequent etching processes. The difference in etching rates of hard mask 106 and oxide layer 104/dielectric layer 102 allows for improved rounding process control of metal layer 106 as will be explained in greater detail below.

The tapering of sidewalls 110a and the formation of passivation layer 112 may be achieved by controlling the process conditions of the etching process used on oxide layer 104, which maybe a dry etch process. For example, a larger amount of bias power may be applied to high radio frequencies during the dry etching than power applied to low radio frequencies to promote sidewall tapering and passivation layer 112 formation in openings 110. In some embodiments, a bias power of about 100 W to about 500 W is applied to high radio frequencies while a bias power of about 0 W to about 50 W is applied to low radio frequencies. Furthermore, the etching process may occur at a pressure of about 20 mTorr to about 80 mTorr and at a temperature of about 40° to about 70° Celsius while applying a DC power supply voltage between about 0V and about negative 500V. Suitable process gases for the formation of a passivation layer may include fluorocarbon gases (e.g., $C_xF_y$, applied at a flow rate of about 20 standard cubic centimeters per minute (sccm) to about 50 sccm), $N_2$ (e.g., at a flow rate of about 0 sccm to about 100 sccm), $O_2$ (e.g., at a flow rate of about 0 sccm to about 25 sccm), Ar (e.g., at a flow rate of about 0 sccm to about 100 sccm), or the like. A byproduct of the process gas used during etching forms a passivation layer 112 on sidewalls of openings 110.

Figure 4:
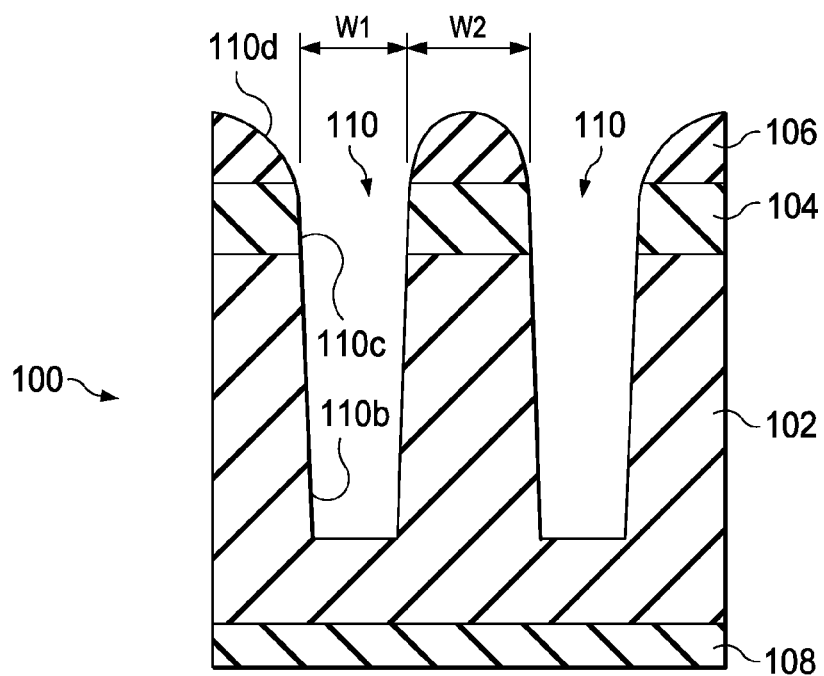

FIG. 4 illustrates the further etching of dielectric layer 102 to extend openings 110 into dielectric layer 102, forming trenches. The etching process used on dielectric layer 102 may further cause sidewalls 110d of openings 110 in hard mask 106 to have a rounded profile. The rounded profile allows for increased process robustness, for example, by reducing overhang formation, or the like.

As previously discussed, the formation of passivation layer 112 reduces the etch rate of hard mask 106 passivated by the polymer rich layer (e.g., sidewall 110d). The etch rate of hard mask 106 may be sufficiently lower than the etch rate of oxide layer 104, and the etch rate of oxide layer 104 and dielectric layer 102 to allow for the rounding of hard mask 106 during etching while still achieving substantially perpendicular profiles for sidewalls (e.g., sidewalls 110b and 110c) of openings 110 in oxide layer 104 and dielectric layer 102. Because passivation layer 112 is also formed on sidewalls of openings 110 in oxide layer 104, the etch rate of oxide layer may also be lower than the etch rate of dielectric layer 102. For example, the etch rate of dielectric layer 102 may be between about 10 Å/s and about 20 Å/s, the etch rate of oxide layer 104 may be between about 5 Å/s and about 10 Å/s, while the etch rate of hard mask 106 may be less than 1 Å/s. These differences in etch rates allows for better control during the rounding process and facilitates accuracy in achieving desired critical dimensions for semiconductor device while forming trenches in dielectric layer 102 (e.g., width W1 of the trench opening and width W2 of the isolation spacing between trenches).

In some embodiments, after the etching process shown in FIG. 4, sidewalls 110d of openings 110 in hard mask 106 may have a slope angle between about 70° to about 80°, whereas sidewalls 110c/110b of openings 110 in oxide layer 104 and dielectric layer 102 may have a slope with an angle greater than about 85°. As a result of the substantially perpendicular profile of sidewall portions 110c and 110b, more desirable critical dimensions for semiconductor device 100 may be achieved during trench formation while simultaneously rounding hard mask 106. For example, the process described generally allows for a smaller width W1 of trench openings. The process may also allow for an increased width W2 of spacing between trenches for improved isolation between trenches without increasing the pitch (i.e., W1 plus W2) of trenches 110. Thus, a wider process window for trench-fill and better leakage control may be achieved in semiconductor device 100.

To promote rounding of hard mask 106, a larger bias power may be applied to high radio frequencies during etching than low radio frequencies to promote hard mask 106 rounding. However, sufficient bias power may be applied to low radio frequencies to provide a desired bombardment power for etching trenches. In some embodiments, a bias power of about 50 W to about 200 W is applied to high radio frequencies while a bias power of about 0 W to about 100 W is applied to low radio frequencies. Furthermore, the etching process may occur at a pressure of about 20 mTorr to about 80 mTorr and at a temperature of about 50° to about 70° Celsius. Suitable process gases for the formation of a passivation layer may include fluorocarbon gases (e.g., $C_xF_y$, applied at a flow rate of about 20 sccm to about 50 sccm), $N_2$ (e.g., at a flow rate of about 0 sccm to about 100 sccm), $O_2$ (e.g., at a flow rate of about 0 sccm to about 25 sccm), Ar (e.g., at a flow rate of about 0 sccm to about 100 sccm), or the like.

Figure 5:
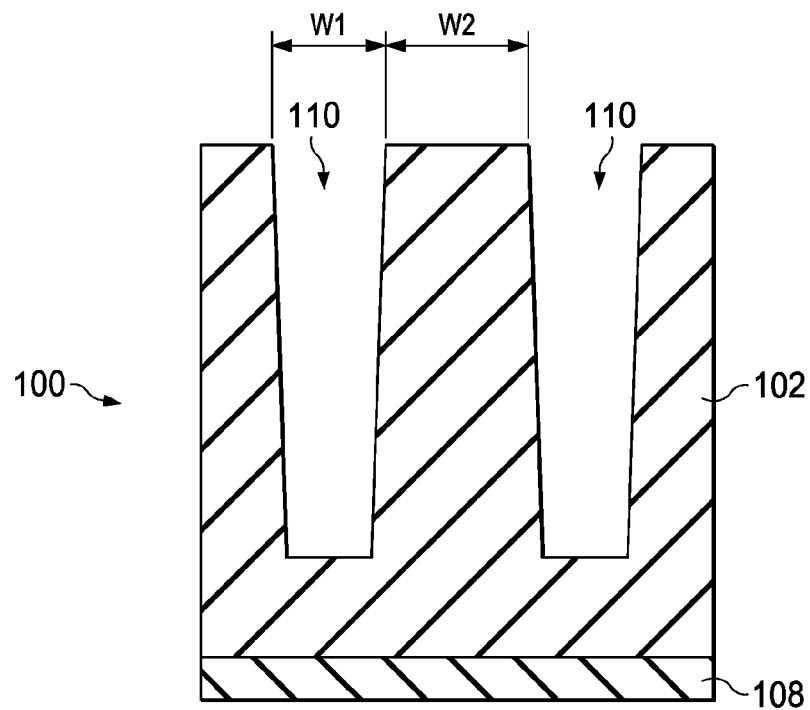

Subsequently, in FIG. 5, a planarization (e.g., a chemical mechanical polish (CMP) or an etch back technique) may be applied to remove hard mask 106 and oxide layer 104. Thus, trenches 110 having substantially perpendicular sidewalls (e.g., having an angle greater than about 85°) are formed in dielectric layer 102. Trenches 110 may have a width W1 and be separated from other trenches by a width W2. W1 and W2 may vary depending on desired critical dimensions of semiconductor device 100. In some embodiments, width W1 maybe between about 44 nm and about 64 nm, and width W2 may be between about 20 nm and about 26 nm.

Figure 6:
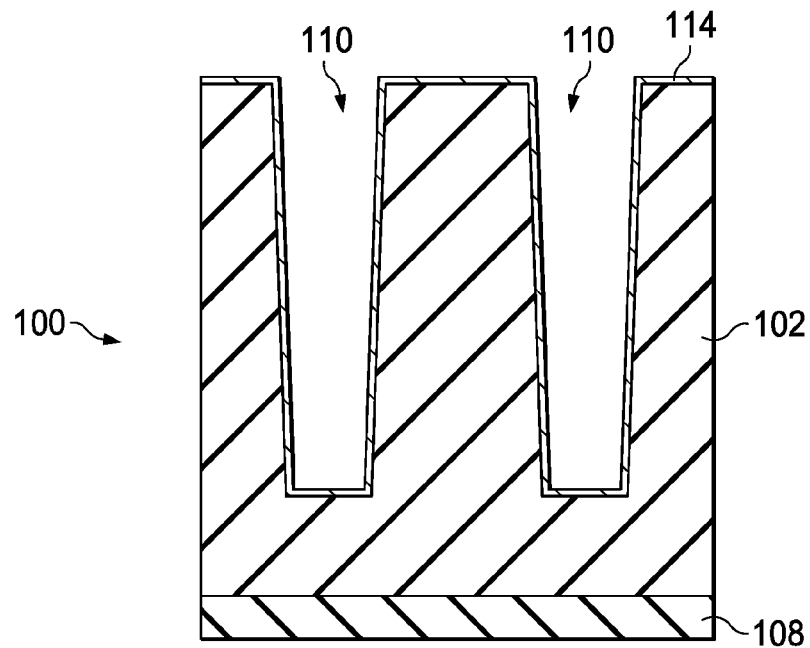

FIG. 6 illustrates the formation of a barrier layer 114 in trenches 110. Barrier layer 114 may cover sidewalls and a bottom surface of trenches 110. Barrier layer 114 may comprise, for example, titanium nitride, titanium oxide, tantalum nitride, tantalum oxide or the like. Barrier layer 114 may prevent the diffusion of metallic material of subsequently formed vias into the surrounding dielectric layer 102. Barrier layer 114 may be deposited using any suitable deposition process, such as CVD, PVD, a conformal deposition process, or the like.

Figure 7:
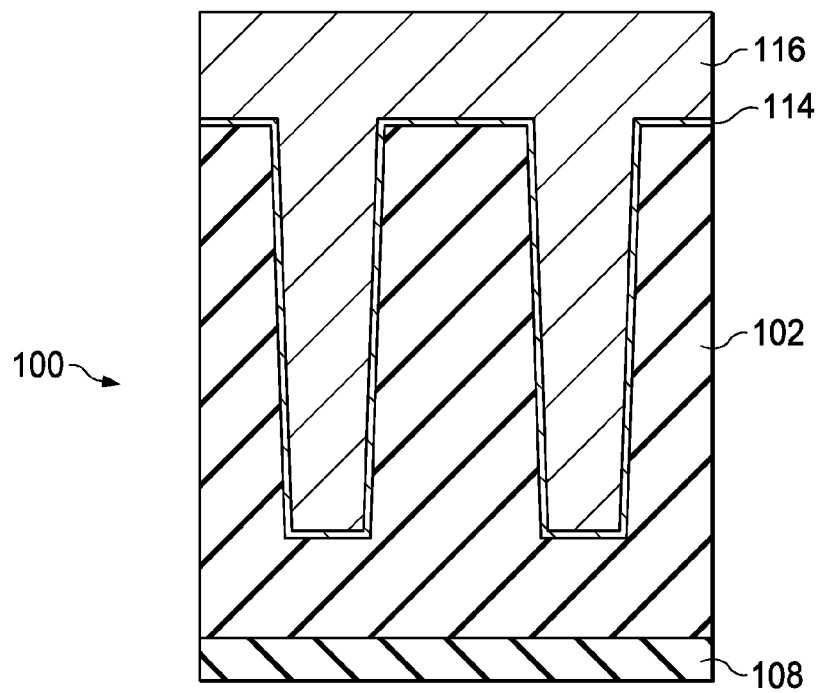
Figure 8:
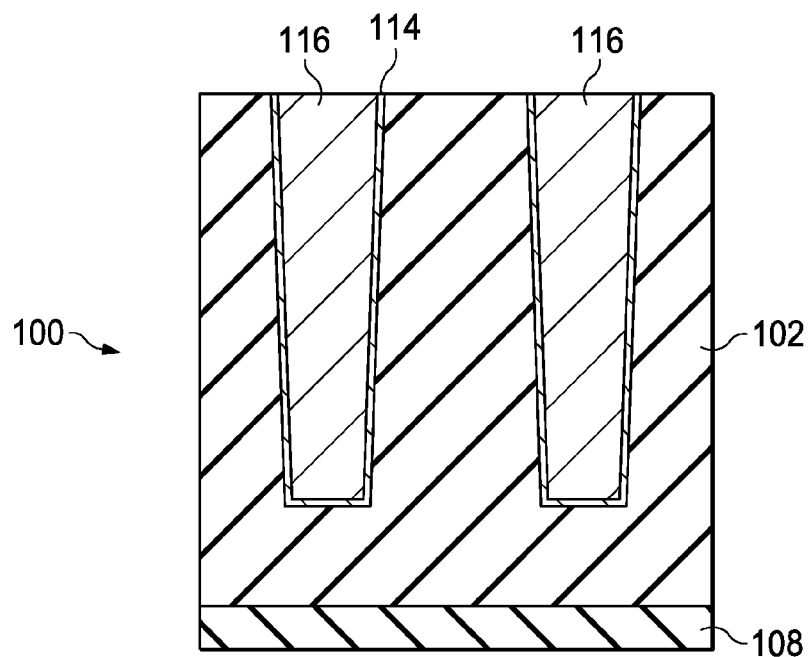

FIGS. 7 and 8 illustrate the filling of trenches 110 to form conductive features 116 (e.g., lines or vias) in dielectric layer 104. First, as illustrated by FIG. 7, a metallic material 116 such as copper, a copper alloy, tungsten, aluminum, or another suitable conductor may be deposited into trenches 110. The deposition of metallic material 116 may overflow trenches 110 and dielectric layer 102. Subsequently, as illustrated by FIG. 8, a planarization (e.g., CMP or etch back) maybe used to remove overflow portions. As part of the planarization, top portions of barrier layer 114 may also be removed. Thus, conductive features 116 are formed in dielectric layer 102.

Figure 9:
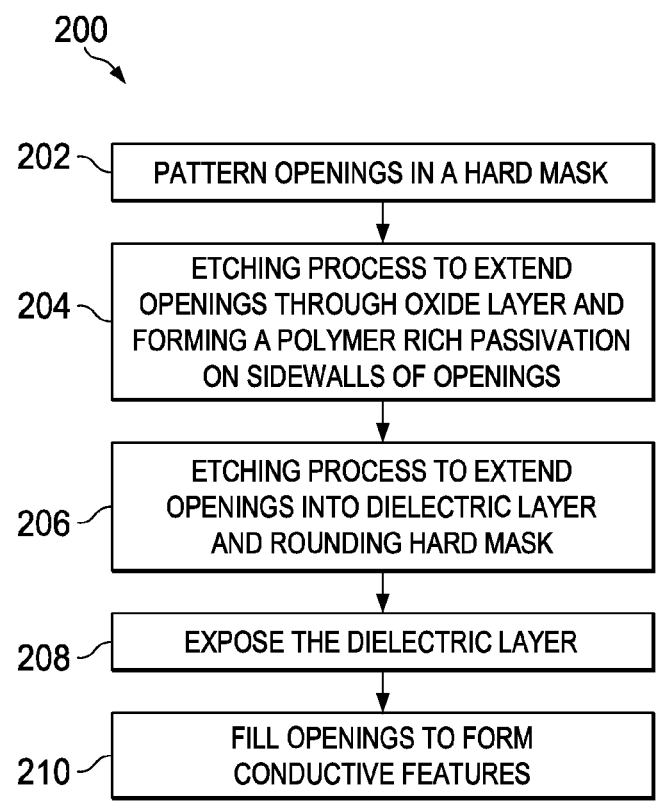
FIG. 9 illustrates a flow chart for forming trenches in a semiconductor device layer in accordance with various embodiments.

FIG. 9 illustrates a process flow 200 for forming trenches/conductive features in a dielectric layer in accordance with various embodiments. A hard mask may be disposed over the dielectric layer with an oxide layer disposed between the hard mask and the dielectric layer. First, in step 202, the hard mask disposed is patterned, for example, using a combination of photolithography and etching.

Next in step 204, the oxide layer may be etched to extend the openings through the oxide layer. The etching process conditions applied to the oxide layer may be selected to taper sidewalls of the openings. For example, after the etching process, sidewalls of the openings may be sloped at an angle of about 80°. A process gas used during the etching process may further form a polymer rich passivation layer on sidewalls of the openings. In particular, the passivation layer may be formed on sidewalls of the openings in the hard mask. The passivation layer reduces the etch rate of the hard mask compared to the etch rate of the oxide layer and the dielectric layer in subsequent process steps.

In step 206, another etching process may then be performed to form trenches in the dielectric layer by extending the openings into the dielectric layer. The process conditions of this etching process may be controlled to achieve desired critical dimensions in the dielectric layer. The sidewalls of the opening may also be etched to form a rounded profile in the hard mask and a substantially perpendicular profile in the oxide layer and the dielectric layer. The passivation layer reduces the etch rate of the hard mask and allows for the etching process to round the hard mask while still forming substantially perpendicular sidewalls for portions of the openings in the oxide and dielectric layers. The rounded hard mask reduces overhang issues and increases the process window for filling the trenches in subsequent steps. In step 208, the dielectric layer is exposed by removing the hard mask and oxide layer, for example, using a planarization process. Finally, in step 210, the openings are filled with a conductive material (e.g., a metal) to form conductive features (e.g., lines and/or vias) in the dielectric layer.

In accordance with an embodiment, a method includes forming a hard mask over a dielectric layer, patterning the hard mask to form an opening, forming a passivation layer on sidewalls of the opening, and forming a trench in the dielectric layer by extending the opening into the dielectric layer using an etching process. The sidewalls of the opening are etched to form a rounded profile in the hard mask and a substantially perpendicular profile in the dielectric layer.

In accordance with another embodiment, a method includes forming an oxide layer over a dielectric layer and forming a hard mask over the oxide layer. The method further includes patterning the hard mask to form an opening, etching the oxide layer to taper sidewalls of the opening, and etching the dielectric layer to extend the opening into the dielectric layer. The method further includes etching sidewalls of the opening to form a profile for the sidewalls, and wherein the profile is rounded in the hard mask and substantially perpendicular profile in the oxide layer and the dielectric layer.

In accordance with yet another embodiment, a method includes patterning a hard mask to form an opening, wherein the hard mask is disposed over a dielectric layer and etching an oxide layer disposed between the hard mask and the dielectric layer. Etching the oxide layer extends the opening through the oxide layer, tapers sidewalls of the opening, and forms a passivation layer on the sidewalls of the opening. The method further includes etching the dielectric layer. Etching the dielectric layer extends the openings into the dielectric layer, rounds the sidewalls of the opening in the hard mask, and forms substantially perpendicular sidewalls of the opening in the oxide layer and dielectric layer. The dielectric layer is then exposed by removing the hard mask and the oxide layer, and the opening is filled with a metallic material to form a conductive feature in the dielectric layer.

In accordance with an embodiment, a method includes forming a hard mask over a dielectric layer, patterning an opening in the hard mask, and extending the opening into the dielectric layer using a first etching process. The first etching process forms a passivation layer on sidewalls of the opening. After the first etching process, the method further includes forming a trench in the dielectric layer by extending the opening further into the dielectric layer using a second etching process.

In accordance with another embodiment, a method includes forming an oxide layer over a dielectric layer, forming a hard mask over the oxide layer, and etching an opening extending through the hard mask and the oxide layer. Etching the opening includes forming a passivation layer on sidewalls of the oxide layer and the hard mask in the opening, wherein a portion of the passivation layer on the hard mask is thicker that a portion of the passivation layer on the oxide layer. After etching the opening, the method further includes forming a trench in the dielectric layer by etching the dielectric layer to extend the opening into the dielectric layer.

In accordance with yet another embodiment, a method includes patterning a first opening and a second opening in a hard mask disposed over a dielectric layer and etching an oxide layer disposed between the hard mask and the dielectric layer. The first opening is adjacent to the second opening, and etching the oxide layer extends the first opening and the second opening through the oxide layer. The method further includes etching the dielectric layer to extend the first opening and the second opening into the dielectric layer, form rounded sidewalls for the first opening and the second opening in the hard mask, and form substantially perpendicular sidewalls for the first opening and the second opening in the oxide layer and dielectric layer.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. A method comprising:
    forming a hard mask over a dielectric layer;
    patterning an opening in the hard mask;
    extending the opening into the dielectric layer using a first etching process, wherein the first etching process forms a passivation layer on sidewalls of the opening; and
    after the first etching process, forming a trench in the dielectric layer by extending the opening further into the dielectric layer using a second etching process.

2. The method of claim 1, wherein forming the trench in the dielectric layer comprises etching sidewalls of the opening to form a rounded profile in the hard mask and a substantially profile in the dielectric layer.

3. The method of claim 1 further comprising prior to forming the hard mask, forming an oxide layer over the dielectric layer, wherein the hard mask formed over the oxide layer.

4. The method of claim 3, wherein the first etching process forms the passivation layer to have a first thickness on sidewalls of the hard mask and a second thickness on sidewalls of the oxide layer, wherein the first thickness is greater than the second thickness.

5. The method of claim 3, wherein forming the oxide layer comprises a thermal oxidation process.

6. The method of claim 1, wherein the second etching process comprises etching the dielectric layer at a faster rate than the hard mask.

7. The method of claim 1 further comprising, after forming the trench:
exposing the dielectric layer;
forming a barrier layer covering sidewalls and a bottom surface of the trench; and
filling the trench with a metallic material.

8. A method comprising:
forming an oxide layer over a dielectric layer;
forming a hard mask over the oxide layer;
etching an opening extending through the hard mask and the oxide layer, wherein etching the opening comprises forming a passivation layer on sidewalls of the oxide layer and the hard mask in the opening, wherein a portion of the passivation layer on the hard mask is thicker that a portion of the passivation layer on the oxide layer; and
after etching the opening, forming a trench in the dielectric layer by etching the dielectric layer to extend the opening into the dielectric layer.

9. The method of claim 8, wherein etching the opening comprises:
etching the opening in the hard mask to expose the oxide layer; and
etching the oxide layer to taper sidewalls of the opening and form the passivation layer.

10. The method of claim 9, wherein etching the oxide layer comprises using a fluorocarbon, nitrogen, oxygen, or argon as a process gas.

11. The method of claim 9, wherein etching the oxide layer comprises applying a first bias power of between about 100 W and about 500 W to a first radio frequency and applying a second bias power of between about 0 W and about 50 W to a second radio frequency, wherein the first radio frequency is higher than the second radio frequency.

12. The method of claim 8, wherein the passivation layer reduces an etching rate of the hard mask during forming the trench in the dielectric layer.

13. The method of claim 8 wherein forming the trench comprises an etching process that etches the hard mask a first etch rate, the oxide layer at a second etch rate, and the dielectric layer at a third etch rate, wherein the first etch rate is lower than the second etch rate, and wherein the second etch rate is lower than the third etch rate.

14. The method of claim 8, wherein etching the opening extending through the hard mask and the oxide layer further comprises etching the dielectric layer to a first depth, wherein the passivation layer is formed on a surface of the dielectric layer, and wherein the trench extends to a second depth greater than the first depth.

15. The method of claim 8, wherein the passivation layer is a polymer-rich layer formed by a process gas used during etching the opening extending through the hard mask and the oxide layer.

16. A method comprising:
patterning a first opening and a second opening in a hard mask disposed over a dielectric layer, wherein the first opening is adjacent to the second opening;
etching an oxide layer disposed between the hard mask and the dielectric layer, wherein etching the oxide layer extends the first opening and the second opening through the oxide layer; and
etching the dielectric layer, wherein etching the dielectric layer extends the first opening and the second opening into the dielectric layer, forms rounded sidewalls for the first opening and the second opening in the hard mask, and forms substantially perpendicular sidewalls for the first opening and the second opening in the oxide layer and dielectric layer.

17. The method of claim 16, wherein after etching the dielectric layer, a width of the first opening in the dielectric layer is less than a distance between the first opening and the second opening.

18. The method of claim 16, wherein etching the oxide layer tapers sidewalls of the first opening and the second opening and forms a polymer rich passivation layer in the first opening and the second opening.

19. The method of claim 16 further comprising:
exposing the dielectric layer by removing the hard mask and the oxide layer; and
filling the first opening and the second opening with a metallic material.

20. The method of claim 16, wherein after etching the dielectric layer, the rounded sidewalls have a first angle defined by the rounded sidewalls and a top surface of the dielectric layer of between about 70° and about 80°, and wherein the substantially perpendicular sidewalls have a second angle defined by the substantially perpendicular sidewalls and the top surface of the dielectric layer that is greater than about 85°.

* * * * *